(12) United States Patent
Lee et al.

(10) Patent No.: US 9,269,729 B2
(45) Date of Patent: Feb. 23, 2016

(54) THIN FILM TRANSISTOR ARRAY PANEL AND MANUFACTURING METHOD OF THE SAME

(71) Applicant: SAMSUNG DISPLAY CO., LTD., Yongin (KR)

(72) Inventors: Kwang-Ho Lee, Suwon-si (KR); Jang-Soo Kim, Yongon-si (KR); Hong-Suk Yoo, Anyang-si (KR); Sang-Soo Kim, Seoul (KR); Shi-Yul Kim, Yongin-si (JP); Jae-Hyoung Youn, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/727,286

(22) Filed: Jun. 1, 2015

(65) Prior Publication Data

US 2015/0270296 A1    Sep. 24, 2015

Related U.S. Application Data

(62) Division of application No. 12/414,932, filed on Mar. 31, 2009, now Pat. No. 9,046,727.

(30) Foreign Application Priority Data

Aug. 26, 2008    (KR) ........................ 10-2008-0083421

(51) Int. Cl.
*H01L 27/12*    (2006.01)
*G02F 1/1362*    (2006.01)
*G02F 1/1339*    (2006.01)

(52) U.S. Cl.
CPC ...... *H01L 27/1262* (2013.01); *G02F 1/136209* (2013.01); *G02F 1/136227* (2013.01); *G02F 1/13394* (2013.01);

(Continued)

(58) Field of Classification Search
CPC .................................................. H01L 27/1262
See application file for complete search history.

(56) References Cited

U.S. PATENT DOCUMENTS 6,031,512 A    2/2000    Kadota et al.
6,873,382 B2    3/2005    Chang et al.

(Continued)

FOREIGN PATENT DOCUMENTS

JP    2001066617    3/2001
JP    2002236286    8/2002

(Continued)

*Primary Examiner* — Robert Carpenter
(74) *Attorney, Agent, or Firm* — Cantor Colburn LLP

(57) ABSTRACT

A thin film transistor ("TFT") array panel includes; an insulation substrate, a TFT disposed on the insulation substrate and including a drain electrode, a passivation layer covering the TFT and including a contact portion disposed therein corresponding to the drain electrode, a partition comprising an organic material disposed on the passivation layer, and including a transverse portion, a longitudinal portion, and a contact portion disposed on the drain electrode, a color filter disposed on the passivation layer and disposed in a region defined by the partition, an organic capping layer disposed on the partition and the color filter, and a pixel electrode disposed on the organic capping layer, and connected to the drain electrode through the contact portion of the passivation layer and the contact portion of the partition, wherein a contact hole is formed in the organic capping layer corresponding to the contact portion of the passivation layer.

7 Claims, 13 Drawing Sheets

(52) U.S. Cl.
CPC .. *G02F 2001/136222* (2013.01); *H01L 27/124* (2013.01); *H01L 27/1248* (2013.01)

(56) References Cited

U.S. PATENT DOCUMENTS

| | | | |
|---|---|---|---|
| 7,193,668 B2 | 3/2007 | Kim | |
| 7,405,428 B2 | 7/2008 | Yun | |
| 7,598,102 B1 | 10/2009 | Yu et al. | |
| 7,701,534 B2 | 4/2010 | Lee et al. | |
| 9,046,727 B2 * | 6/2015 | Lee | G02F 1/136209 |
| 2004/0195573 A1 | 10/2004 | Kim | |
| 2005/0151901 A1 | 7/2005 | Kikkawa et al. | |
| 2006/0006385 A1 | 1/2006 | Park | |

FOREIGN PATENT DOCUMENTS

| | | |
|---|---|---|
| JP | 2002350887 | 12/2002 |
| JP | 2004318063 | 11/2004 |
| KR | 1020000052103 | 8/2000 |
| KR | 100397671 | 8/2003 |
| KR | 1020040001695 | 1/2004 |
| KR | 1020040085792 | 10/2004 |
| KR | 1020040087067 | 10/2004 |
| KR | 1020050105576 | 11/2005 |
| KR | 1020060086738 | 8/2006 |
| KR | 1020070089352 | 8/2007 |
| KR | 1020080076496 | 8/2008 |

* cited by examiner

FIG. 16

| Color | Not Fill | Margin | Overflow |
|---|---|---|---|
| Red | 35d | 38 ~ 80d<br>70d : 0.654 (Rx) | 83d |
| Green | 40d | 43 ~ 68d<br>68d : 0.588 (Gy) | 70d |
| Blue | 33d | 35 ~ 68d<br>68d : 0.081 (By) | 70d |

FIG. 17

| Color | Not Fill | Margin | Overflow |
|---|---|---|---|
| Red | 8d | 10 ~ 120d<br>68d : 0.659 (Rx) | 125d |
| Green | 10d | 13 ~ 105d<br>68d : 0.606 (Gy) | 110d |
| Blue | 10d | 13 ~ 105d<br>68d : 0.078 (By) | 110d |

| Color | Not Fill | Margin | Overflow |
|---|---|---|---|
| Red | 10d | 13 ~ 100d / 68d : 0.659 (Rx) | 103d |
| Green | 15d | 18 ~ 98d / 68d : 0.606 (Gy) | 100d |
| Blue | 10d | 13 ~ 103d / 68d : 0.078 (By) | 105d |

THIN FILM TRANSISTOR ARRAY PANEL AND MANUFACTURING METHOD OF THE SAME

This application is a divisional of U.S. patent application Ser. No. 12/414,932, filed on Mar. 31, 2009, which claims priority to Korean Patent Application No. 10-2008-0083421, filed on Aug. 26, 2008, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor ("TFT") substrate and a manufacturing method thereof.

(b) Description of the Related Art

A liquid crystal display ("LCD") is one of the most commonly used flat panel displays, and it includes two substrates with electrodes formed thereon and a liquid crystal layer interposed between the two substrates. In the LCD, a voltage is applied to the electrodes to align liquid crystal molecules of the liquid crystal layer to thereby regulate the transmittance of light passing through the liquid crystal layer.

Among the various types of LCDs, an LCD having a structure in which field generating electrodes are respectively formed on two display panels is widely used. Among the two display panels, a plurality of pixel electrodes and thin film transistors ("TFTs") are arranged in a matrix format on one display panel (hereinafter referred to as "a TFT array panel"), and color filters of red, green, and blue are formed on the other display panel and one common electrode covers the entire surface of the other display panel (hereinafter referred to as "a common electrode panel").

However, in this type of liquid crystal display, the pixel electrodes and the color filters are disposed on different display panels such that it is difficult to align the pixel electrodes and the color filters to each other, thereby generating an alignment error.

To solve this problem, a color filter on array ("CoA") structure in which the pixel electrode and the color filter are formed on the same display panel is provided. Here, a light blocking member is generally formed on the same display panel as the pixel electrode as well as the color filter.

When forming the color filter on the same display panel as the pixel electrode, the color filter is formed through an Inkjet printing process, thereby reducing the manufacturing time and cost by simplifying the manufacturing process. The light blocking member is formed as a partition in the Inkjet printing method.

However, the partition of the light blocking member has a low height such that it is difficult to sufficiently divide the color filter formed by the Inkjet printing. Also, the partition of the light blocking member is tapered, but the taper angle is small such that it is difficult to stably enclose the color filter.

In the color filter on array ("CoA") structure, a contact hole for electrically connecting the pixel electrode and the drain electrode is formed in the color filter, however the process is not easy. This is because the color filter or the black matrix between the pixel electrode and the drain electrode must be removed, and the removal may involve multiple precise steps.

BRIEF SUMMARY OF THE INVENTION

The present invention provides a method and apparatus to sufficiently form a color filter by using a structure that does not include a light blocking member when forming the color filter through Inkjet printing, and to easily form a contact hole exposing a drain electrode without a problem of an electrical connection between the pixel electrode and the drain electrode.

An exemplary embodiment of a thin film transistor array panel according to the present invention includes; an insulation substrate, a thin film transistor ("TFT") disposed on the insulation substrate and including a drain electrode, a passivation layer covering the TFT and including a contact portion disposed therein corresponding to the drain electrode, a partition comprising a transparent organic material disposed on the passivation layer, and including a transverse portion, a longitudinal portion, and a contact portion disposed on the drain electrode, a color filter disposed on the passivation layer and disposed in a region defined by the partition, an organic capping layer disposed on the partition and the color filter, and a pixel electrode connected to the drain electrode through the contact portion of the passivation layer and the contact portion of the partition, wherein a contact hole is formed in the organic capping layer corresponding to the contact portion of the passivation layer and the contact portion of the partition layer.

In one exemplary embodiment, the TFT array panel may further include a light blocking member disposed on the pixel electrode, and a spacer comprising substantially the same material as the light blocking member disposed on the pixel electrode and which has a top surface disposed at a greater distance from the insulation substrate than a top surface of the light blocking member.

In one exemplary embodiment, the light blocking member may include a transverse portion overlapping the transverse portion of the partition, and a longitudinal portion overlapping the longitudinal portion of the partition.

In one exemplary embodiment, the longitudinal portion and the transverse portion of the light blocking member may be wider than the longitudinal and transverse portions of the partition, respectively.

In one exemplary embodiment, the light blocking member and the spacer may be integrally formed as a single unitary and indivisible unit, and a portion having a greatest distance from the insulation substrate functions as a spacer.

In one exemplary embodiment, the partition may be disposed under the spacer.

In one exemplary embodiment, the partition may have a thickness of about 2 μm to about 10 μm.

In one exemplary embodiment, the partition may be inclined with respect to the insulation substrate, and the inclination angle may be in the range of about 50° to about 120°.

In one exemplary embodiment, the transparent organic material for the partition may include an organic material having a low dielectric ratio of less than about 4, or may be at least one selected from the group consisting of an interface surfactant, a silicon (Si) group, and a fluorine (F) group.

In one exemplary embodiment, the TFT array panel may further include a metal pattern disposed under the passivation layer, and disposed on a region corresponding to the contact portion of the partition.

In one exemplary embodiment, one pixel may include first and second TFTs, the first TFT is connected to a gate line and a first data line, the second TFT is connected to the gate line and a second data line, and the pixel electrode may include a first subpixel electrode connected to the first TFT and a second subpixel electrode connected to the second TFT.

In one exemplary embodiment, the first and second subpixel electrodes may respectively include a slit pattern.

In one exemplary embodiment, the longitudinal portion of the partition may be formed with respect to a region between neighboring first data lines and second data lines, and overlaps the portion of the first data line and the second data line.

In one exemplary embodiment, the transverse portion of the partition may overlap the gate lines.

An exemplary embodiment of a method for manufacturing a TFT array panel according to the present invention includes; disposing a TFT including a drain electrode on a substrate, disposing a passivation layer on the TFT and the substrate, depositing an transparent organic material on the passivation layer and patterning the transparent organic material to form a partition including a transverse portion, a longitudinal portion, and a contact portion disposed on the drain electrode, forming a color filter in a region defined by the partition through an Inkjet printing method, depositing an organic capping layer covering the partition and the color filter and removing a portion of the organic capping layer aligned with the drain electrode, removing a contact portion of the partition and a portion of the passivation layer by a dry etch method to form a contact hole which exposes the drain electrode; and electrically connecting a pixel electrode to the drain electrode through the contact hole.

In one exemplary embodiment, the method may further include disposing a light blocking member overlapping the partition and disposing a spacer on the pixel electrode.

In one exemplary embodiment, the disposing of the light blocking member and the disposing of the spacer includes; coating a photosensitive resist on substantially the entire surface of the organic capping layer by dispersing black pigments, and patterning the photosensitive layer using an exposure mask including a transparent region, a translucent region, and a light blocking region through exposure and developing to form position dependent thicknesses.

In one exemplary embodiment, the formation of the partition may include combining fluorine on the surface of the partition after the formation of the partition.

In one exemplary embodiment, the thickness of the partition may be in a range of about 2 μm to about 10 μm.

In one exemplary embodiment, the partition may be inclined with respect to the insulation substrate, and the inclination angle is in a range of about 50° to about 120°.

In one exemplary embodiment, the transverse and longitudinal portions of the partition may overlap at least a portion of a data line and a gate line connected to the TFT.

According to an exemplary embodiment of the present invention, the partition made of an organic layer extends from the substrate a significant distance, and the color filter is formed through an Inkjet process such that the color impression may be improved, mixing of colors of neighboring color filters may be prevented, and the contact hole exposing the drain electrode may be easily formed. Further, in some exemplary embodiments additional elements do not exist on the corresponding substrate besides the common electrode such that the manufacturing process of the corresponding substrate may be simplified, and a misalignment between two substrates is small.

BRIEF DESCRIPTION OF THE DRAWINGS

FIG. 16 is a table comparing a number of drops in consideration of color reproducibility and a number of drops for a formation margin of a color filter when using a light blocking member as a partition.

FIG. 17 is a table comparing a number of drops in consideration of color reproducibility and a number of drops for a formation margin of a color filter when using an organic layer of about 3.5 μm as a partition.

DETAILED DESCRIPTION OF THE INVENTION

Figure 1:
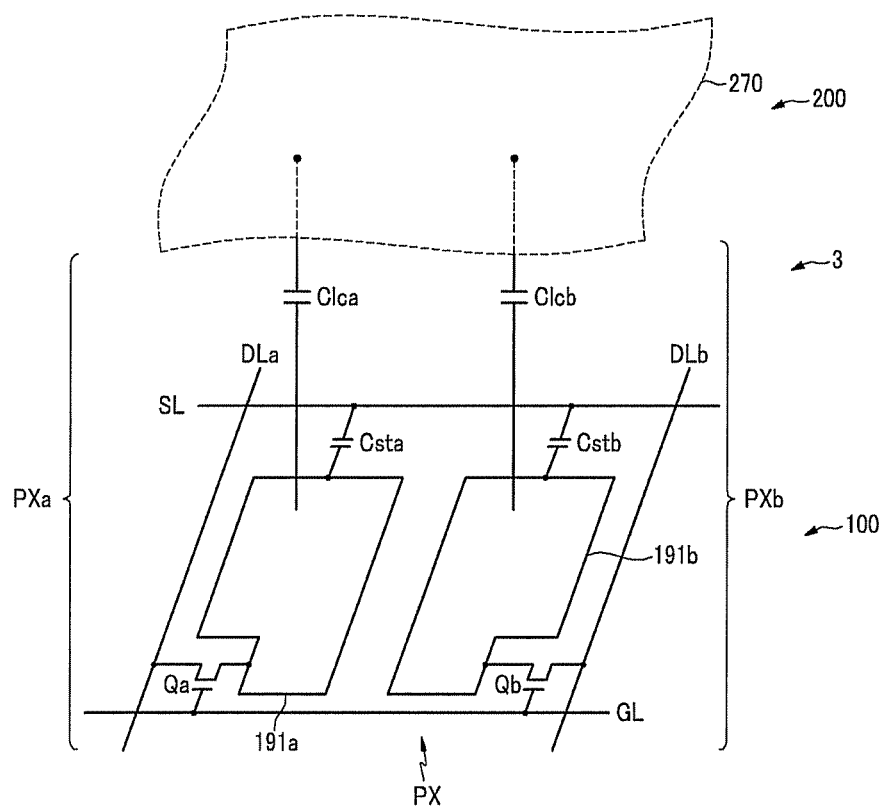
FIG. 1 is an equivalent circuit diagram of an exemplary embodiment of one pixel of an exemplary embodiment of a liquid crystal display ("LCD") according to the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is an equivalent circuit diagram of an exemplary embodiment of one pixel in an exemplary embodiment of a liquid crystal display ("LCD") according to the present invention.

Referring to FIG. 1, an exemplary embodiment of an LCD ("LCD") according to the present invention includes signal lines including a plurality of gate lines GL, a plurality of pairs of data lines DLa and DLb, and a plurality of storage electrode lines SL, and a plurality of pixels PX connected to the signal lines. From a structural point of view, the LCD includes a lower panel 100 and an upper panel 200 facing each other, and a liquid crystal layer 3 interposed therebetween.

Each pixel PX includes a pair of subpixels PXa and PXb. Each subpixel PXa/PXb includes a switching element Qa/Qb, a liquid crystal capacitor Clca/Clcb, and a storage capacitor Csta/Cstb.

Each switching element Qa/Qb is a three-terminal element such as a thin film transistor ("TFT") provided on the lower panel 100, and includes a control terminal connected to the gate line GL, an input terminal connected to the data line DLa/DLb, and an output terminal connected to the liquid crystal capacitor Clca/Clcb and the storage capacitor Csta/Cstb.

The liquid crystal capacitor Clca/Clcb uses a subpixel electrode 191a/191b and a common electrode 270 as two terminals thereof. The liquid crystal layer 3 between electrodes 191a/191b and 270 functions as a dielectric material.

The storage capacitor Csta/Cstb serving as an assistant to the liquid crystal capacitor Clca/Clcb is formed as a storage electrode line SL provided on the lower display panel 100 and a subpixel electrode 191a/191b overlaps with an insulator interposed therebetween, and a predetermined voltage such as the common voltage Vcom is applied thereto.

A predetermined voltage difference is applied to the two liquid crystal capacitors Clca and Clcb. For example, the data voltage applied to the liquid crystal capacitor Clca is less or more than the data voltage applied to the liquid crystal capacitor Clcb. Therefore, when the voltages of the first and second liquid crystal capacitors Clca and Clcb are appropriately adjusted, it is possible to make an image viewed from the side be as similar as possible to an image viewed from the front, and as a result it is possible to improve the side visibility of the display.

Next, an exemplary embodiment of a TFT array panel according to the present invention will be described in detail with reference to FIG. 2 and FIG. 3.

Figure 2:
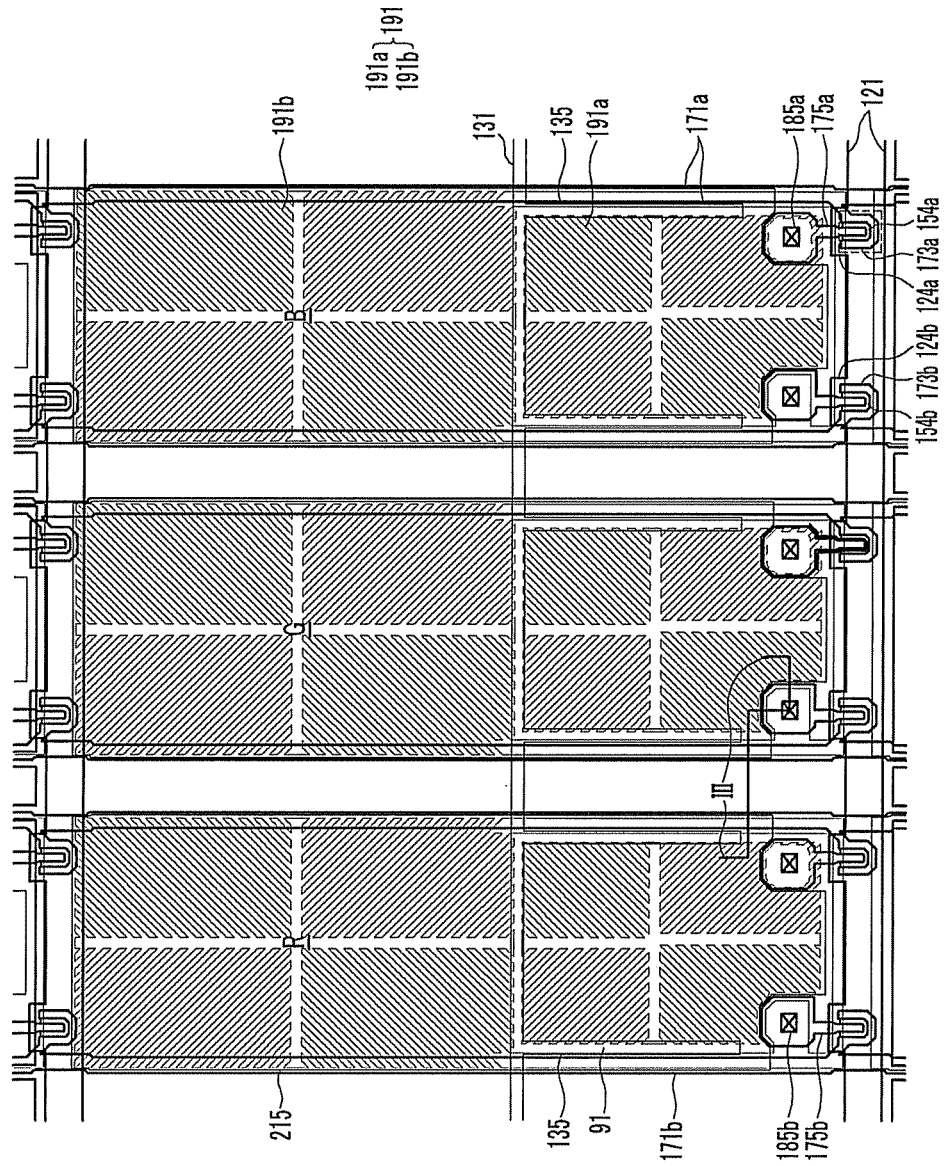
FIG. 2 is a top plan view of an exemplary embodiment of a thin film transistor ("TFT") array panel according to the present invention.
Figure 3:
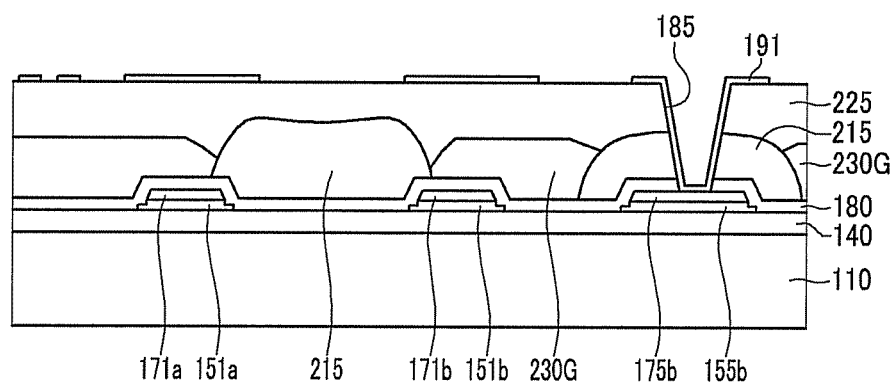
FIG. 3 is a cross-sectional view taken along line III-III of FIG. 2.

FIG. 2 is a top plan view of an exemplary embodiment of a TFT array panel according to the present invention, and FIG. 3 is a cross-sectional view of the exemplary embodiment of a TFT array panel shown in FIG. 2 taken along line III-III.

A plurality of gate lines 121 and a plurality of storage electrode lines 131 and 135 are formed on an insulating substrate 110.

The gate lines 121 transmit gate signals and extend in the substantially transverse direction. Each gate line 121 includes a plurality of first and second gate electrodes 124a and 124b protruding upward therefrom.

In the present exemplary embodiment, the storage electrode lines include a stem 131 extending substantially parallel to the gate lines 121, and a plurality of storage electrodes 135 branching from the stem 131. However, alternative exemplary embodiments include configurations wherein the shapes and arrangements of the storage electrode lines 131 and 135 may be modified in various forms.

A gate insulating layer 140 is formed on the gate lines 121 and the storage electrode lines 131 and 135, and a plurality of semiconductors 154a and 154b, exemplary embodiments of which may be made of amorphous or crystallized silicon, are formed on the gate insulating layer 140.

A pair of a plurality of ohmic contacts may be formed on the first semiconductors 154a and 154b, and exemplary embodiments of the ohmic contacts may be formed of a material such as n+ hydrogenated amorphous silicon in which an n-type impurity is doped with a high concentration, or of silicide.

A plurality of pairs of data lines 171a and 171b and a plurality of first and second drain electrodes 175a and 175b are formed on the ohmic contacts and on the gate insulating layer 140.

The data lines 171a and 171b transmit data signals, extend in the substantially longitudinal direction, and are disposed substantially perpendicular to the gate lines 121 and the stems of the storage electrode lines 131. Each data line 171a/171b includes a plurality of first/second source electrodes 173a/173b extending toward the first/second gate electrodes 124a/124b and curved with a "U" shape, and the first/second source electrodes 173a/173b are opposite to the first/second drain electrodes 175a/175b with respect to the first/second gate electrodes 124a/124b, respectively.

Each of the first and second drain electrodes 175a and 175b starts from one end, which is enclosed by the first source electrode 173a, and extends upward, and exemplary embodiments of the other end of the first and second drain electrodes 175a and 175b may have a wide area for connection with another layer.

However, above described exemplary embodiments of the shapes and arrangement of the first and second drain electrodes 175a and 175b and the data lines 171a and 171b may be modified in various forms.

A first/second gate electrode 124a/124b, a first/second source electrode 173a/173b, a first/second drain electrode 175a/175b, along with a first/second semiconductor 154a/154b respectively form a first/second TFT Qa/Qb, and a channel of the first/second TFT Qa/Qb is formed on the first/second semiconductor 154a/154b between the first/second source electrode 173a/173b and the first/second drain electrode 175a/175b.

The ohmic contacts are interposed only between the underlying semiconductor islands 154a and 154b, and the overlying data lines 171a and 171b and drain electrodes 175a and 175b, and reduce contact resistance therebetween. The semiconductors 154a and 154b have a portion that is exposed without being covered by the data lines 171a and 171b and the drain electrodes 175a and 175b, and a portion between the source electrodes 173a and 173b and the drain electrodes 175a and 175b.

In the present exemplary embodiment, the ohmic contacts, the data lines 171a, 171b, 173a, and 173b, and the drain electrodes 175a and 175b have the same shape as seen from a top plan view, and have substantially the same plane shape as the semiconductors 154a and 154b except for the exposed portion between the drain electrodes 175a and 175b and source electrodes 173a and 173b.

A passivation layer 180, exemplary embodiments of which may be made of silicon nitride or silicon oxide, is formed on the data lines 171a and 171b, the drain electrodes 175a and 175b, and the exposed portions of the semiconductors 154a and 154b.

A partition 215, exemplary embodiments of which may be made of an organic material, is formed on the passivation layer 180, and a color filter 230G, exemplary embodiments of which may be formed by Inkjet printing, is formed in the region defined by the partition 215.

Firstly, the partition 215 includes a transverse portion substantially parallel to the gate line 121 and a longitudinal portion substantially parallel to the two neighboring data lines 171a and 171b and the region therebetween, and a contact portion formed on the position where a pixel electrode and a drain electrode are connected to each other, and it defines a region where the color filter will be formed. Exemplary embodiments of the organic material for the partition 215 include a low dielectric organic material having a dielectric ratio of less than about 4. Also, the thickness of the partition 215 is in the range of about 2 μm to about 10 μm, and is inclined at an inclination angle of about 50° to about 120° with respect to the substrate 110. Here, when the angle is more than about 90°, it is referred to as a reverse taper structure.

The color filters 230R, 230G, and 230B are formed in the region where the partition 215 is not formed. In the present exemplary embodiment, the height of the partition 215 is high and the taper angle is large such that the color filters 230R, 230G, and 230B are stably and uniformly filled.

An organic capping layer 225 is formed on the partition 215 and the color filters 230R, 230G, and 230B. Exemplary embodiments of the organic capping layer 225 may be made of an organic material having photosensitivity, and the dielectric ratio thereof is less than about 4. The organic capping layer 225 prevents the color filter 230 from being lifted from the substrate 110 and suppresses contamination of the liquid crystal layer 3 by an organic material such as a solvent flowing from the color filter 230G, and thereby problems such as an afterimage that may be generated during driving of the LCD may be prevented.

The passivation layer 180, the partition 215, and the organic capping layer 225 have contact holes 185a and 185b exposing the drain electrodes 175a and 175b.

A plurality of pixel electrodes 191 are formed on the organic capping layer 225.

Each pixel electrode 191 includes the first and second subpixel electrodes 191a and 191b that are separated from each other with a gap 91 therebetween.

In the present exemplary embodiment, the overall shape of the pixel electrode 191 is a quadrangle, and it includes a cross-shaped stem having a transverse stem and a longitudinal stem which intersect. The pixel electrode 191 is divided into four sub-regions by the transverse stem and the longitudinal stem, and each of the sub-regions include a plurality of minute branches.

One set of the minute branches obliquely extends from the transverse stem or the longitudinal stem in the upper-left direction, and another set obliquely extends from the transverse stem or the longitudinal stem in the upper-right direction. Also, a further set obliquely extends from the transverse stem or the longitudinal stem in the lower-left direction, and the final set obliquely extends from the transverse stem or the longitudinal stem in the lower-right direction.

In the present exemplary embodiment, the minute branches form an angle of about 45 degrees or about 135 degrees with the gate lines 121. Also, the minute branches of two neighboring sub-regions may be substantially perpendicular to one another.

Although not shown, exemplary embodiments include configurations wherein the width of the minute branches may become wider close to the transverse stem or the longitudinal stem.

In one exemplary embodiment, the area occupied by the second subpixel electrode 191b may be larger than the area occupied by the first subpixel electrode 191a in the whole pixel electrode 191, and in such an exemplary embodiment, the basic electrodes 191 may be formed differently from each other to have the area of the second subpixel electrode 191b have about 1.0 to about 2.2 times the area of the first subpixel electrode 191a. However, the shape and the area ratio of the first and second subpixel electrodes 191a and 191b may be variously changed.

Each first/second subpixel electrode 191a/191b is physically and electrically connected to the first/second drain electrode 175a/175b through the contact hole 185a/185b, and receives data voltages from the first/second drain electrode 175a/175b, respectively.

The pattern of the pixel electrode 191 as seen from a top plan view may be formed with various patterns. In the present exemplary embodiment, the pixel electrode 191 includes the first and second subpixel electrodes 191a and 191b, and the first and second subpixel electrodes 191a and 191b are respectively connected to the first and second drain electrodes 175a and 175b, however, in another exemplary embodiment, the pixel electrode 191 may be made of a single electrode and may be connected to one drain electrode.

Although not shown, a LCD including the exemplary embodiment of a TFT array panel according to the present invention includes an upper panel (not shown) facing the TFT array panel.

The upper panel may include a common electrode (not shown) formed on an insulation substrate, and an alignment layer (not shown) formed thereon.

Polarizers (not shown) may be provided on the outer surfaces of the TFT array panel and the common electrode panel.

A liquid crystal layer (not shown) is interposed between the TFT array panel and the common electrode panel.

The above-described TFT array panel for the LCD will now be described with reference to FIG. 4 to FIG. 8 as well as FIG. 2 and FIG. 3.

FIG. 4 to FIG. 8 are cross-sectional views sequentially showing an exemplary embodiment of the manufacturing process of the exemplary embodiment of a TFT array panel shown in FIG. 3, and taken along line III-III of FIG. 2.

Figure 4:
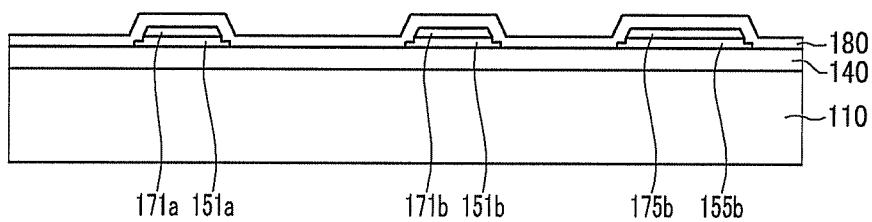
FIG. 4 to FIG. 8 are cross-sectional views sequentially illustrating an exemplary embodiment of the manufacturing process of the exemplary embodiment of a TFT array panel shown in FIG. 3, taken along line III-III of FIG. 2.

In FIG. 4, although the gate line and the portion of the layered structure are not shown for ease of description, they may be formed with the same method as a general manufacturing method of the TFT array panel for the LCD, e.g., chemical vapor deposition ("CVD"), etc. The structure shown in FIG. 4 represents a point where the passivation layer 180 is formed, and it will be described as follows.

A gate line 121 including gate electrodes 124a and 124b is formed on an insulation substrate 110, a gate insulating layer is formed on the substrate 110 including the gate line 121, and an amorphous silicon layer which is not doped with an impurity, an amorphous silicon layer which is doped with an impurity, and a data conductive layer are sequentially deposited. Next, a photosensitive film (not shown) is coated on the data conductive layer and developed using a slit mask to form a photoresist pattern having different thicknesses depending on position. Next, the data conductive layer, the intrinsic amorphous silicon layer, and the extrinsic amorphous silicon layer are firstly etched using the photoresist pattern as a mask to form semiconductors 154a and 154b, and then the data conductive layer is secondly etched to form data lines 171a and 171b including source electrodes 173a and 173b, and drain electrodes 175a and 175b.

Next, the exposed amorphous silicon layer is removed using the source electrodes 173a and 173b and the drain electrodes 175a and 175b as a mask to form ohmic contact layers. Next, a passivation layer 180 is formed on the data lines 171a and 171b, the drain electrodes 175a and 175b, and the gate insulating layer 140.

Figure 5:
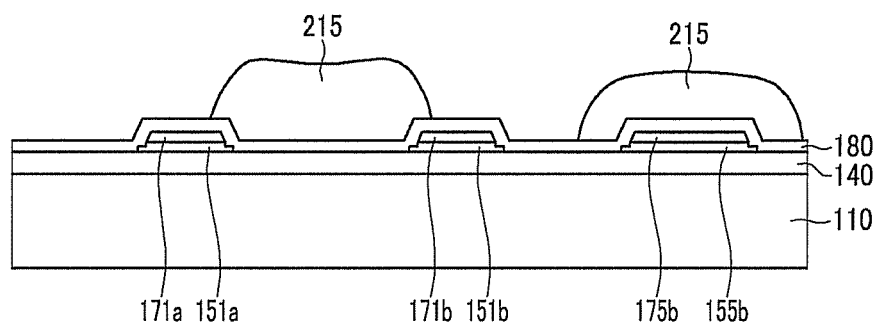

Next, as shown in FIG. 5, a partition 215 made of the organic material is formed with a thickness of about 2 μm to about 10 μm on the passivation layer 180. The partition 215 is formed to overlap the portion of the data lines 171a and 171b on both sides with respect to the center between two neighboring data lines 171a and 171b and the gate line 121, thereby enclosing one pixel area. Also, the partition 215 is formed on the position where the drain electrodes 175a and 175b and the pixel electrode are connected to each other. In the present exemplary embodiment, the organic material is a low dielectric ratio organic material having a dielectric ratio of less than about 4, and the side walls thereof are inclined with respect to the surface to the substrate 110 with an inclination angle in a range of about 50° to about 120°. Here, an angle of more than 90° indicates a reverse taper structure.

Exemplary embodiments of the organic material used to form the partition 215 may include an interface surfactant and at least one material selected from a silicon (Si) group and a fluorine (F) group, and the fluorine is combined to the surface of the partition 215 and a surface treatment may be executed thereto to improve the surface characteristics of the partition 215 after forming the partition 215.

Figure 6:
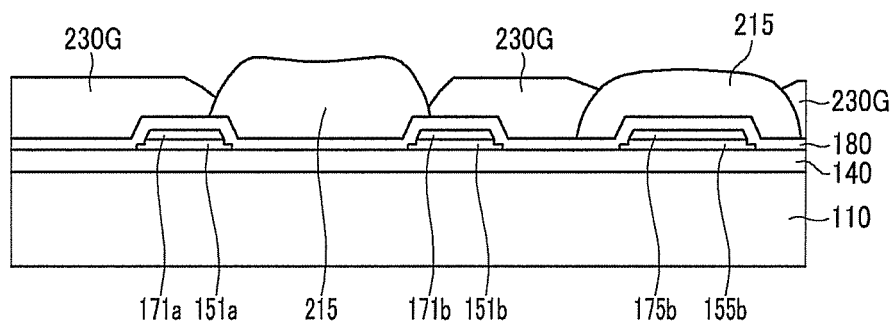

Color filters 230R, 230G, and 230B are formed through an Inkjet printing process, as shown in FIG. 6. The partition 215 is tapered, and the height thereof is high such that the color filters 230R, 230G, and 230B are stably formed in the partition. This will be described below with respect to FIG. 13.

Figure 7:
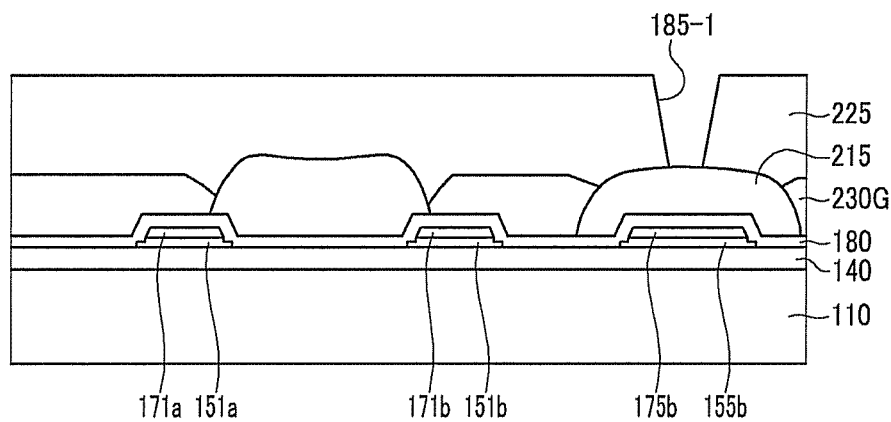

Next, as shown in FIG. 7, an organic capping layer 225 is formed on the partition 215 and the color filters 230R, 230G, and 230B and pattered through an exposure and developing process to form an opening 185-1 on the portion corresponding to the drain electrodes 175a and 175b.

Figure 8:
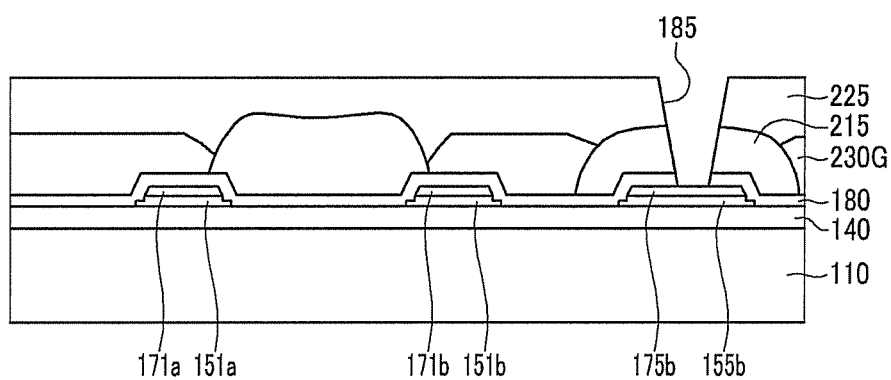

Next, as shown in FIG. 8, the partition 215 and the passivation layer 180 at the region where the organic capping layer 225 is opened are removed through a dry etch method to form contact holes 185.

When the exemplary embodiment of a TFT array panel according to the present invention is formed, a light blocking member to additionally block the light is also formed, and the light blocking member will be described with reference to FIG. 9 and FIG. 10.

Figure 9:
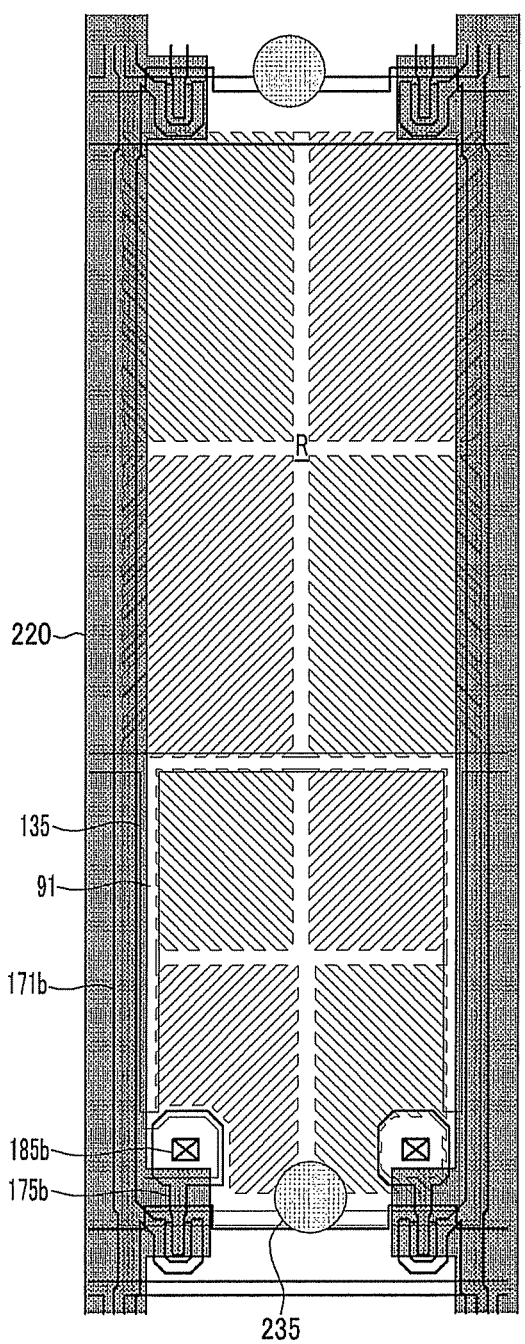
FIG. 9 is a top plan view of a formation position of an exemplary embodiment of a light blocking member in a TFT array panel according to the present invention.
Figure 10:
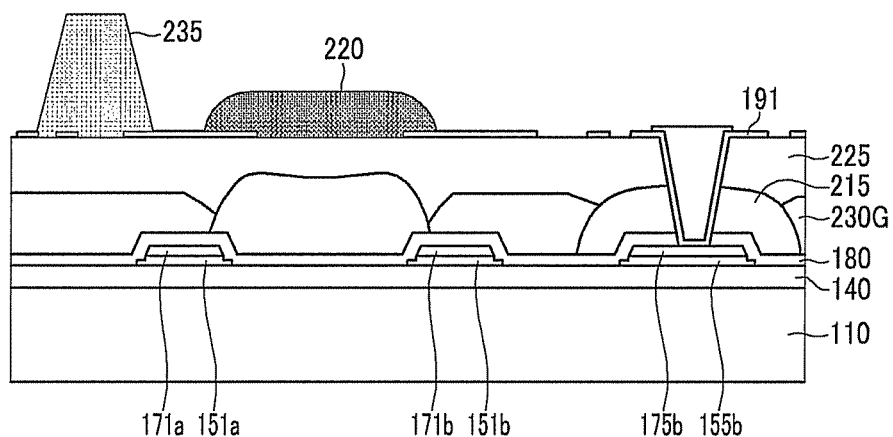
FIG. 10 is a cross-sectional view of the exemplary embodiment of a spacer and the light blocking member shown in FIG. 9.

FIG. 9 is a top plan view of a formation position of a light blocking member in an exemplary embodiment of a TFT array panel according to the present invention, and FIG. 10 is a cross-sectional view of the spacer and the light blocking member shown in FIG. 9.

According to FIG. 9 and FIG. 10, the light blocking member 220 includes a longitudinal portion formed in the longitudinal direction substantially parallel to two neighboring data lines 171a and 171b and formed in the region therebetween, and a transverse portion extending from the longitudinal portion substantially parallel to the gate line 121. Here, the longitudinal and transverse portions of the light blocking member 220 overlap the longitudinal and transverse portions of the partition 215, and in one exemplary embodiment the width of the longitudinal and transverse portions of the light blocking member 220 may be wider than the longitudinal and transverse portions of the partition 215. Also, the light blocking member 220 may be formed on the region of the contact portion of the partition 215. Furthermore, when forming the light blocking member 220, a spacer 235 may be simultaneously formed. According to one exemplary embodiment, the spacer 235 may be made of substantially the same material as the light blocking member 220 such that the spacer 235 blocks the light, and the spacer 235 has a higher height than the light blocking member 220 such that it functions to uniformly maintain an interval between the upper substrate and the lower substrate.

To form the light blocking member 220 and the spacer 235, a photosensitive resist dispersed with black pigments is coated on the substrate, and is exposed and developed using an exposure mask having a transparent region, a translucent region, and a light blocking region for the black photosensitive resist to have the different thicknesses depending on position. A slit pattern, a lattice pattern, or a thin film having medium transmittance or medium thickness is provided on the translucent region.

According to an exemplary embodiment of the present invention the spacer is disposed on the gate line 121, and is spaced away from two neighboring light blocking members 220 by the predetermined distance. Alternative exemplary embodiments than that shown in FIG. 9 and FIG. 10, include configurations wherein the position of the spacer 235 may be non-specific, and may be formed on the outer area of the substrate as well as on the data line and the gate line.

Figure 11:
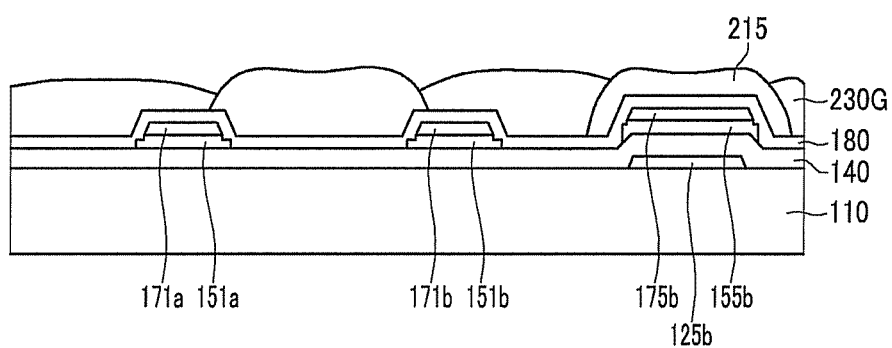
FIG. 11 is a cross-sectional view of another exemplary embodiment of a TFT array panel according to the present invention.

FIG. 11 is a cross-sectional view of another exemplary embodiment of a TFT array panel according to of the present invention.

FIG. 11 is as a cross-sectional view corresponding to FIG. 6, and a gate metal pattern 125b is added thereto in contrast to FIG. 6.

The gate metal pattern 125b is formed with substantially the same material as the gate line 121, and is electrically separated from the gate line 121 and the gate electrodes 124a and 124b. Also, the gate metal pattern 125b is disposed under the contact portion of the partition 215, that is, the portion where the pixel electrode and the drain electrode are electrically connected to each other. The gate metal pattern 125b reduces the thickness of the partition 215 that is removed through the exposure and developing such that the drain electrode may be easily exposed. That is, the thickness of the passivation layer 180 that is etched by the dry etch method is the same, however the thickness of the partition 215 is reduced such that the time for the exposure and developing to create a contact hole therethrough is reduced. In comparison to FIG. 6, where the thickness of the partition 215 to be etched to expose the passivation layer 180 is about 1.3 μm, for example, the gate metal pattern 125b of FIG. 11 with a thickness of about 0.4 μm reduces the thickness of the partition 215 to be etched to about 0.9 μm. According to an exemplary embodiment, the gate metal pattern 125b may be formed with a different layer from that of the gate line 121, however exemplary embodiments include configurations wherein the gate metal pattern 125b is disposed under the passivation layer 180.

Figure 12:
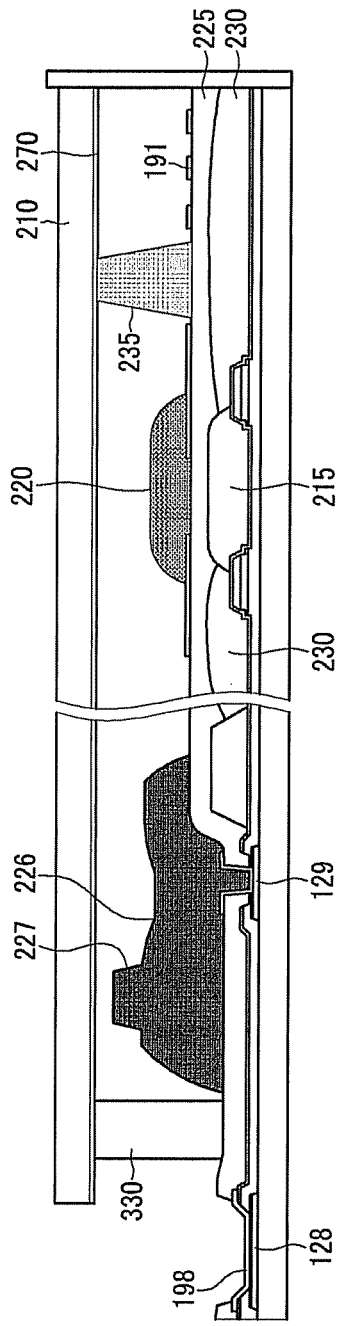
FIG. 12 is a cross-sectional view of another exemplary embodiment of a TFT array panel according to the present invention, and shows the outer portion of the display panel.

FIG. 12 is a cross-sectional view of another exemplary embodiment of a TFT array panel according to the present invention, and shows an outer portion of the display panel.

FIG. 12 is a cross-sectional view corresponding to FIG. 10, and when forming the light blocking member 220 and the spacer 235, an outer light blocking member 226 made of a material to block the light is formed on the outer area of the display substrate, and the outer light blocking member 226 may have a different height from that of the light blocking member 220 of the display area. Also, the outer light blocking member 226 may have more than two high points, and the portion of the highest height among them may have the function of an outer spacer 227 supporting the interval between the upper and lower substrates.

The outer spacer 227 is shown to maintain the interval between the upper and lower substrates while contacting with the upper substrate.

In one exemplary embodiment, the light blocking member 220, the spacer 235, the outer light blocking member 226, and the outer spacer 227 are all formed through one exposure and developing process using a single mask. The mask includes a translucent region or a slit pattern, and controls the exposure amount to control the height of each pattern.

In one exemplary embodiment, the portion covered by the outer light blocking member 226 corresponds to a driving circuit integrated on the substrate.

Next, a characteristic improvement due to the present invention will be described. Firstly, the taper structure will be described.

Figure 13:
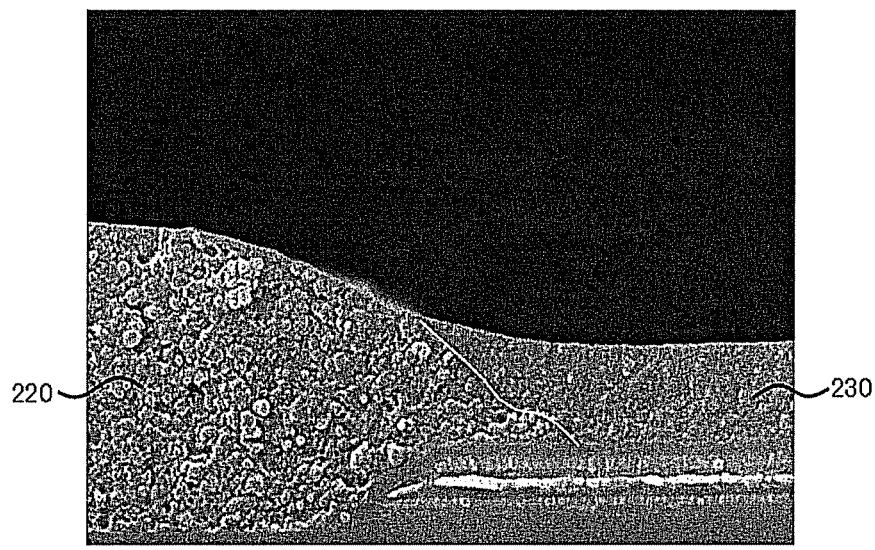
FIG. 13 is a view illustrating a cross-sectional profile of a partition when forming the partition using a light blocking member.
Figure 14:
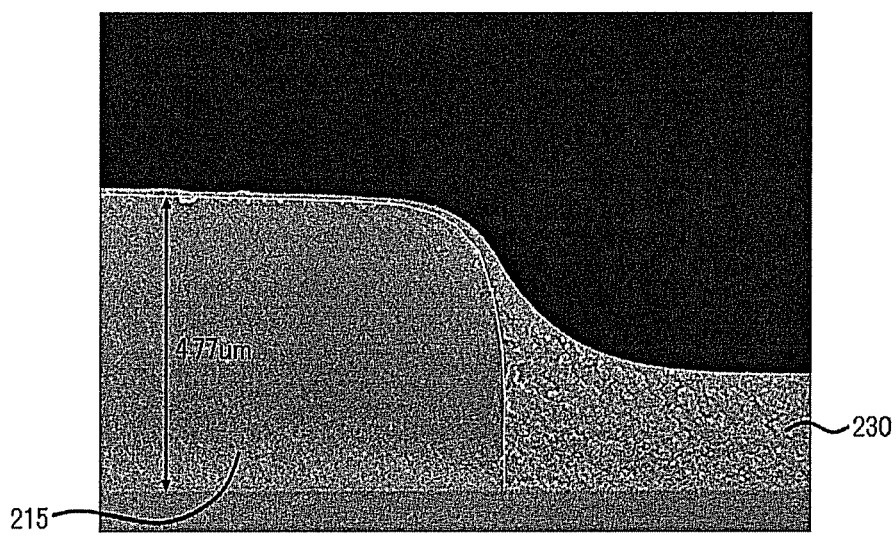
FIG. 14 is a view illustrating a cross-sectional profile of a partition when forming the partition using an organic material according to an exemplary embodiment of the present invention.
Figure 15:
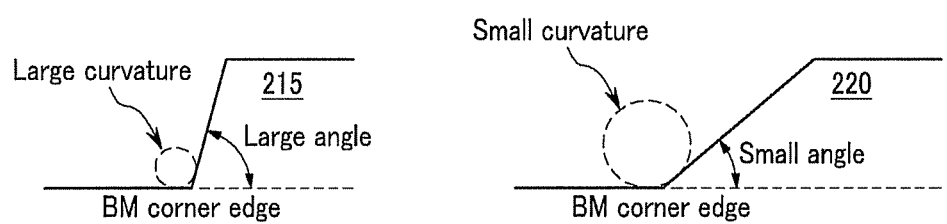
FIG. 15 is a diagram illustrating differences according to taper angle and a filling effect thereof.

FIG. 13 is a view illustrating a cross-sectional profile of a partition when forming the partition using a light blocking member, FIG. 14 is a view illustrating a cross-sectional profile of a partition when forming the partition using an organic material according to an exemplary embodiment of the present invention, and FIG. 15 is a diagram illustrating the difference according to a taper angle and a filling effect thereof.

Firstly, as shown in FIG. 13, when a partition is formed using a light blocking member partition, it may be confirmed that the height is low and the taper angle is small. The light is blocked using a material for the light blocking member such as copper black. However, when the material is formed thickly, it is difficult to pattern it such that the thickness may not be greater than a predetermined amount. Also, there is a characteristic that the taper angle is small after the etching process.

In contrast, in the exemplary embodiment when the partition is formed using the organic material as shown in FIG. 14, the height of the partition may be high. The height is shown as about 4.77 μm in FIG. 14, but the height thereof may be greater than this value. Also, the side surface of the partition has the taper structure and the taper angle is large. FIG. 14 shows the exemplary embodiment having an angle that is close to about 90 degrees. The organic material is easily etched such that there are merits that a thick structure may be etched quickly and may retain the large taper angle.

FIG. 15 is a diagram illustrating differences according to taper angle and a filling effect thereof. That is, when a partition having a small angle as in FIG. 13 is formed using the light blocking member and the color filter is formed through Inkjet printing, a capillary force are smaller at the corresponding corner region compared with that of FIG. 14 such that the color filter is not easily filled. This effect is similar to that when a capillary tube having a small radius is used and a column of the water may be more highly raised as compared to a thicker column of water, and the capillary force may be calculated by the formula below.

$$\text{Capillary force} = \text{surface tension} * \text{curvature} \qquad \text{(Equation 1)}$$

That is, the capillary force is proportional to the curvature, and when the curvature is large the color filter is uniformly formed in the corner, as in the case of FIG. 14, whereas if the curvature is small, the color filter material will tend to not fill the entire area between adjacent light blocking members 220.

Next, the margin related to color reproducibility will be described.

For displaying a predetermined position on the color coordinate through the color filter in the LCD, the volume of the color filter across the plurality of pixels must be controlled in consideration of the color reproducibility of each color. The volume of the color filter is controlled through the amount of drops dispersed by Inkjet printing in the Inkjet printing method.

Figures 18, 19:
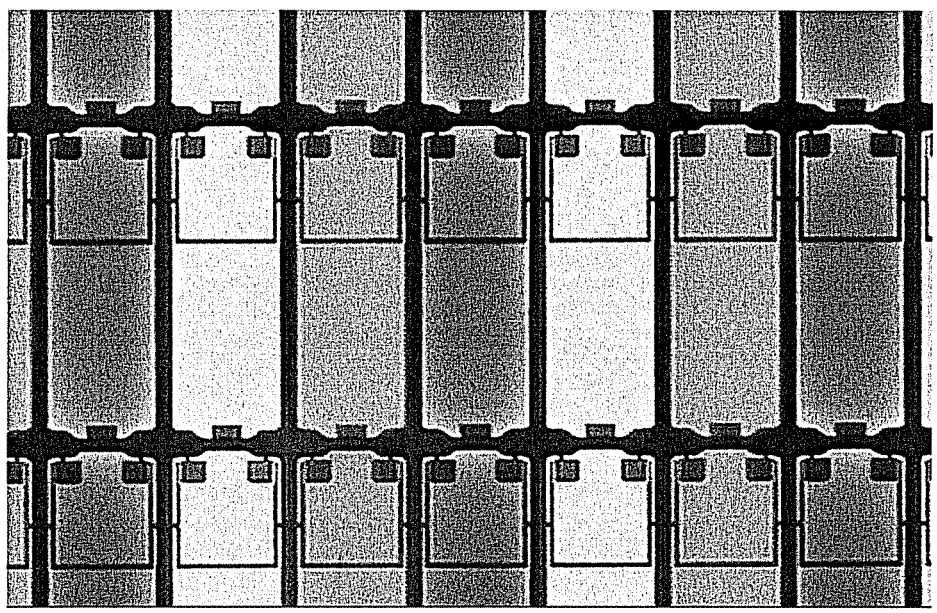
FIG. 18 is a table comparing a number of drops in consideration of color reproducibility and a number of drops for a formation margin of a color filter when using an organic layer of about 2 μm as a partition.
FIG. 19 is a photograph illustrating inconsistencies generated in an outer portion of a pixel area when using a light blocking member as a partition.

FIG. 16 is a table comparing a number of drops in consideration of color reproducibility and a number of drops for a formation margin of a color filter when using a light blocking member as a partition, FIG. 17 is a table comparing a number of drops in consideration of color reproducibility and a number of drops for a formation margin of a color filter when using an organic layer of about 3.5 μm as a partition according to the present exemplary embodiment, and FIG. 18 is a table comparing a number of drops in consideration of color reproducibility and a number of drops for a formation margin of a color filter when using an organic layer of about 2 μm as a partition according to the present exemplary embodiment.

Firstly, FIG. 16 will be described. In the case of the red color filter, 35 drops of ink do not normally fill the pixel area and 83 drops overflows the partition into a neighboring pixel, such that an appropriate number of drops is from about 38 to about 80. Here, the required number of red drops in consideration of color reproducibility is 70 drops such that it may be confirmed that the red color filter may be formed within the margin range.

However, the margins of the green and blue color filters are smaller than that of the red color filter. That is, the margin range is from 43 drops to 68 drops in the case of the green, but the required number of drops in consideration of green color reproducibility is 68 drops, which is equal to the upper level of the margin. Also, in the case of the blue, the required number of drops is equal to the upper level of the margin, i.e., 68 drops. As a result, the LCD may be manufactured, but the potential for deteriorations (a color filter overflowing into a neighboring pixel) due to process errors may be generated.

In contrast, it may be confirmed that there are sufficient margins within the manufacturing process with reference to FIG. 17 and FIG. 18. Firstly, the exemplary embodiment of a partition made of an organic layer with a thickness of about 3.5 μm of FIG. 17 will be described.

It may be confirmed that the margin range of the red color filter is from 10 drops to 120 drops, the margin range of the green color filter is from 13 drops to 105 drops, and the margin range of the blue color filter is from 13 drops to 105 drops. Also, since the required number for each of the color filters is 68 drops, the margin range is sufficiently large such that the deteriorations are not generated. For instance, none of the required number of drops is on the boundary of the process margins as in the previously described configuration.

An exemplary embodiment of a partition made of an organic layer with a thickness of about 2 μm of FIG. 18 will now be described.

It may be confirmed that the margin range of the red color filter is from 13 drops to 100 drops, the margin range of the green color filter is from 18 drops to 98 drops, and the margin range of the blue color filter is from 13 drops 103 drops. Given that the required number of drops of each color filter is 68 drops, it is confirmed that the margin range is sufficiently large. While the margin range is smaller than that of FIG. 17, the margin range is sufficient such that the deteriorations are not generated.

Differently from what is described above, when the light blocking member is used as the partition, the problems stated below may be generated and the organic partition is used to alleviate these problems.

Figure 20:
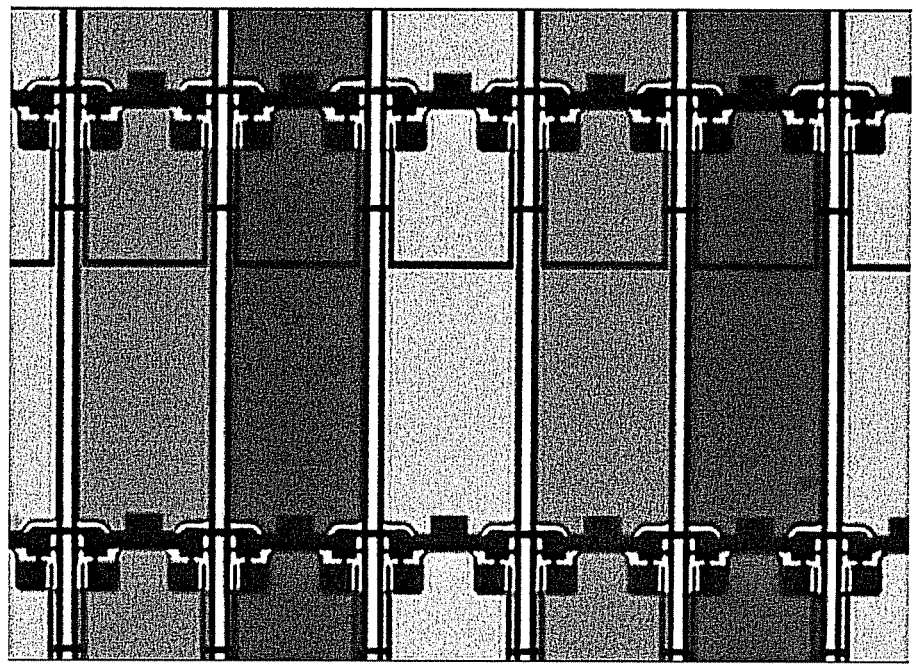
FIG. 20 is a photograph illustrating a lack of inconsistencies in an outer portion of a pixel area when using an organic material as a partition.

FIG. 19 is a photograph illustrating inconsistencies that are generated in an outer portion of a pixel area when using a light blocking member as a partition, and FIG. 20 is a photograph illustrating a lack of inconsistencies in an outer portion of a pixel area when using an organic material as a partition.

As shown in FIG. 19, the color filter is not uniformly filled due to the side profile of the partition of the light blocking member, and as a result a region on the circumference of the pixel area does not uniformly display the color of the color filter, (in FIG. 19, particularly the blue pixel is easily visible) such that the display quality is deteriorated.

In contrast, referring to FIG. 20, when the partition is made of the organic material, the side profile of the partition is good such that the color filter is stably and uniformly filled, and as a result the color impression is not deteriorated at the circumference of the pixel area.

In FIG. 2 to FIG. 8, the structure of the exemplary embodiment of a TFT array panel according to the present invention was described, but the present invention is not limited thereto. Particularly, in FIG. 2 to FIG. 8, one pixel includes two data lines, two TFTs, and two subpixel electrodes, but the present invention is not limited thereto. Also, the partitions 215 are individually disposed in FIG. 2 to FIG. 8, but the present invention is not limited thereto.

An organic material for the partition 215 may be a transparent organic material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, comprising:
   disposing a thin film transistor including a drain electrode on a substrate;
   disposing a passivation layer on the thin film transistor and the substrate;
   depositing a transparent organic material on the passivation layer and patterning the transparent organic material to form a partition including a transverse portion, a longitudinal portion, and a contact portion disposed on the drain electrode;
   forming a color filter in a region defined by the partition through an Inkjet printing method;
   depositing an organic capping layer covering the partition and the color filter;
   removing a portion of the organic capping layer aligned with the drain electrode;
   removing a contact portion of the partition and a portion of the passivation layer by a dry etch method to form a contact hole which exposes the drain electrode; and
   electrically connecting a pixel electrode to the drain electrode through the contact hole.

2. The method of claim 1, further comprising:
   disposing a light blocking member overlapping the partition; and
   disposing a spacer on the pixel electrode.

3. The method of claim 2, wherein, the disposing of the light blocking member and the disposing of the spacer, comprises:
   coating a photosensitive resist on substantially the entire surface of the organic capping layer by dispersing black pigments; and
   patterning the photosensitive layer using an exposure mask including a transparent region, a translucent region, and a light blocking region through exposure and developing to form position dependent thicknesses.

4. The method of claim 1, wherein the formation of the partition includes combining fluorine on the surface of the partition after the formation of the partition.

5. The method of claim 1, wherein the thickness of the partition is in a range of about 2 μm to about 10 μm.

6. The method of claim 1, wherein the partition is inclined with respect to the insulation substrate, and the inclination angle is in a range of about 50° to about 120°.

7. The method of claim 1, wherein the transverse and longitudinal portions of the partition overlap at least a portion of a data line and a gate line connected to the thin film transistor.

* * * * *